United States Patent
Ko et al.

(10) Patent No.: US 9,960,334 B2
(45) Date of Patent: May 1, 2018

(54) THERMOELECTRIC MATERIALS AND THEIR MANUFACTURING METHOD

(71) Applicant: LG CHEM, LTD., Seoul (KR)

(72) Inventors: Kyung-Moon Ko, Daejeon (KR); Tae-Hoon Kim, Daejeon (KR); Cheol-Hee Park, Daejeon (KR)

(73) Assignee: LG CHEM, LTD., Seoul (KR)

( * ) Notice: Subject to any disclaimer, the term of this patent is extended or adjusted under 35 U.S.C. 154(b) by 81 days.

(21) Appl. No.: 14/914,582

(22) PCT Filed: Oct. 17, 2014

(86) PCT No.: PCT/KR2014/009795
§ 371 (c)(1),
(2) Date: Feb. 25, 2016

(87) PCT Pub. No.: WO2015/057018
PCT Pub. Date: Apr. 23, 2015

(65) Prior Publication Data
US 2016/0225970 A1 Aug. 4, 2016

(30) Foreign Application Priority Data

Oct. 17, 2013 (KR) .......... 10-2013-0124040
Oct. 2, 2014 (KR) .......... 10-2014-0133390

(51) Int. Cl.
*H01L 35/16* (2006.01)
*C01B 19/00* (2006.01)
*H01L 35/34* (2006.01)

(52) U.S. Cl.
CPC ............ *H01L 35/16* (2013.01); *C01B 19/002* (2013.01); *C01B 19/007* (2013.01); *H01L 35/34* (2013.01); *C01P 2002/54* (2013.01); *C01P 2006/32* (2013.01); *C01P 2006/40* (2013.01)

(58) Field of Classification Search
CPC ....................................................... H01L 35/16
See application file for complete search history.

(56) References Cited

U.S. PATENT DOCUMENTS

| | | |
|---|---|---|
| 6,091,014 A | 7/2000 | Eklund et al. |
| 2003/0057512 A1 | 3/2003 | Sterzel et al. |
| 2010/0307556 A1 | 12/2010 | Yoon et al. |
| 2012/0055526 A1 | 3/2012 | Rhyee et al. |

(Continued)

FOREIGN PATENT DOCUMENTS

CN 102674270 A 9/2012

OTHER PUBLICATIONS

XingXing. Preparation and Thermoelectric Properties of Cu2Se Based Compounds (Abstract). Wuhan University of Technology. 2011. Retrieved from http://www.dissertationtopic.net/doc/407298 on Jul. 31, 2017.*

(Continued)

*Primary Examiner* — Matthew E Hoban

(57) ABSTRACT

Disclosed is a thermoelectric material with excellent thermoelectric conversion performance. The thermoelectric material is expressed by Chemical Formula 1 below:

$$Cu_xSe_{1-y}X_y \qquad \text{<Chemical Formula 1>}$$

where X is at least one element selected from the group consisting of F, Cl, Br and I, $2 < x \leq 2.6$ and $0 < y < 1$.

15 Claims, 2 Drawing Sheets

(56) References Cited

U.S. PATENT DOCUMENTS

2013/0032188 A1    2/2013  Kajihara et al.
2016/0126439 A1*   5/2016  Shi ..................... C01B 19/002
                                                           136/238

OTHER PUBLICATIONS

Huili Liu et al., "Ultrahigh Thermoelectric Performance by Electron and Phonon Critical Scattering in $Cu_2Se_{1-x}I_x$", Advanced Materials, Dec. 3, 2013, pp. 6607-6612, vol. 25 Issue 45, Wiley-VCH Verlag GmbH & Co. KGaA, Weinheim, http://onlinelibrary.wiley.com/wol1/doi/10.1002/adma.201302660/full#publication-history.

Yunxiang Hu et al., "Deposition of copper selenide thin films and nanoparticles", Journal of Crystal Growth, 2006, pp. 61-65, vol. 297, Elsevier B.V.

Xiao Xingxing, "Preparation of $Cu_2Se$-based compounds and thermoelectric properties thereof", Chinese Master's Dissetations Fulltext Database, No. 1, published on Sep. 15, 2011, pp. 17 and 43.

S. Ohno et al., "Electrical properties of molten $CuCl$—$Cu_2Se$ mixtures," EPJ Web of Conferences, Jan. 1, 2011, pp. 01003-p. 1-01003-p. 6, vol. 15, EDP Sciences.

S. Ohno et al., "The electrical properties of molten $AgX$—$Ag_2Se$ (X=Br, I) mixtures," Journal of Physics: Condensed Matter, Feb. 21, 2000, pp. 1297-1314, vol. 12, No. 7, IOP Publishing Ltd.

Yishen Wang et al., "Preparation and characterization of novel $CuClSe_2$ semiconductor thin film", Materials Letters, Jan. 1, 2009, pp. 236-238, vol. 63, No. 2, Elsevier.

Extended European Search Report for European Patent Application No. 14854063.6, dated Dec. 7, 2016.

International Search Report for International Patent Application No. PCT/KR2014/009795 filed Oct. 17, 2014.

* cited by examiner

THERMOELECTRIC MATERIALS AND THEIR MANUFACTURING METHOD

TECHNICAL FIELD

The present disclosure relates to thermoelectric conversion technology, and more particularly, to a thermoelectric conversion material with excellent thermoelectric conversion properties, its manufacturing method and its use.

The present application is a U.S. National Stage of International Patent Application No. PCT/KR2014/009795 filed Oct. 17, 2014, which claims priority to Korean Patent Application No. 10-2013-0124040 filed on Oct. 17, 2013 and Korean Patent Application No. 10-2014-0133390 filed on Oct. 2, 2014 in the Republic of Korea, the disclosures of which are incorporated herein by reference.

BACKGROUND ART

A compound semiconductor is a compound that is composed of at least two types of elements rather than one type of element such as silicon or germanium and operates as a semiconductor. Various types of compound semiconductors have been developed and are currently being used in various fields of industry. Typically, a compound semiconductor may be used in thermoelectric conversion elements using the Peltier Effect, light emitting devices using the photoelectric conversion effect, for example, light emitting diodes or laser diodes, fuel cells, and the like.

Particularly, a thermoelectric conversion element is used for thermoelectric conversion power generation or thermoelectric conversion cooling applications, and generally includes an N-type thermoelectric semiconductor and a P-type thermoelectric semiconductor electrically connected in series and thermally connected in parallel. The thermoelectric conversion power generation is a method which generates power by converting thermal energy to electrical energy using a thermoelectromotive force generated by creating a temperature difference in a thermoelectric conversion element. Also, the thermoelectric conversion cooling is a method which produces cooling by converting electrical energy to thermal energy using an effect that a temperature difference creates between both ends of a thermoelectric conversion element when a direct current flows through the both ends of the thermoelectric conversion element.

The energy conversion efficiency of the thermoelectric conversion element generally depends on a performance index value or ZT of a thermoelectric conversion material. Here, the ZT may be determined based on the Seebeck coefficient, electrical conductivity, and thermal conductivity, and as a ZT value increases, a thermoelectric conversion material has better performance.

Heretofore, many kinds of thermoelectric conversion materials have been proposed, but there is substantially no thermoelectric conversion material with sufficiently high thermoelectric conversion performance. In particular, thermoelectric conversion materials are applied to more and more fields, and temperature conditions may vary depending on their applied fields. However, since thermoelectric conversion materials may have different thermoelectric conversion performance depending on temperature, each thermoelectric conversion material needs to have optimized thermoelectric conversion performance suitable for its applied field. However, there is not yet proposed a thermoelectric conversion material with optimized performance for various and broad temperature ranges.

DISCLOSURE

Technical Problem

Accordingly, the present disclosure is designed to solve the above problem, and therefore, the present disclosure is directed to providing a thermoelectric material having excellent thermoelectric conversion performance over a broad temperature range, its manufacturing method and its use.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

After repeated studies on the thermoelectric material, the inventors of the present disclosure have successfully synthesized the thermoelectric material expressed by Chemical Formula 1 and found that the thermoelectric conversion material can have excellent thermoelectric conversion performance.

$Cu_xSe_{1-y}X_y$ <Chemical Formula 1>

In Chemical Formula 1, X is at least one element selected from the group consisting of F, Cl, Br and I, $2<x\leq2.6$ and $0<y<1$.

In Chemical Formula 1, x may satisfy a condition of $x\leq2.2$.

In Chemical Formula 1, x may satisfy a condition of $x\leq2.1$.

In Chemical Formula 1, x may satisfy a condition of $2.025\leq x$.

In Chemical Formula 1, y may satisfy a condition of $y<0.1$.

In Chemical Formula 1, y may satisfy a condition of $y\leq0.05$.

In another aspect, the present disclosure also provides a method for manufacturing a thermoelectric material, which includes forming a mixture by weighing and mixing Cu, Se and X according to Chemical Formula 1; and thermally treating the mixture to synthesize a compound expressed by Chemical Formula 1.

Here, the method for manufacturing a thermoelectric material according to the present disclosure may further include sintering the compound under pressure after the compound forming step is performed.

In addition, the pressure sintering step may be performed by means of hot pressing or spark plasma sintering.

Also, to achieve the above object, a thermoelectric conversion element according to the present disclosure includes the thermoelectric material according to the present disclosure.

Also, to achieve the above object, a thermoelectric power generator according to the present disclosure includes the thermoelectric material according to the present disclosure.

Advantageous Effects

According to the present disclosure, a thermoelectric material having excellent thermoelectric conversion performance may be provided.

Particularly, the thermoelectric material according to one aspect of the present disclosure may have low thermal conductivity by adjusting the amount of Cu element added and may also optimize a carrier concentration and enhance electrical conductivity by replacing Se elements with halogen elements.

Accordingly, the thermoelectric material according to the present disclosure may replace a traditional thermoelectric material, or may be used as another material in conjunction with a traditional thermoelectric material.

Moreover, when used in a thermoelectric device for power generation, the thermoelectric material according to the present disclosure may ensure stable thermoelectric conversion performance even if the material is exposed to a comparatively low temperature.

Also, the thermoelectric material according to the present disclosure may be used in a solar cell, an infrared (IR) window, an IR sensor, a magnetic device, a memory, and the like.

DESCRIPTION OF DRAWINGS

The accompanying drawings illustrate a preferred embodiment of the present disclosure and together with the foregoing disclosure, serve to provide further understanding of the technical spirit of the present disclosure, and thus, the present disclosure is not construed as being limited to the drawing.

BEST MODE

Figure 1:
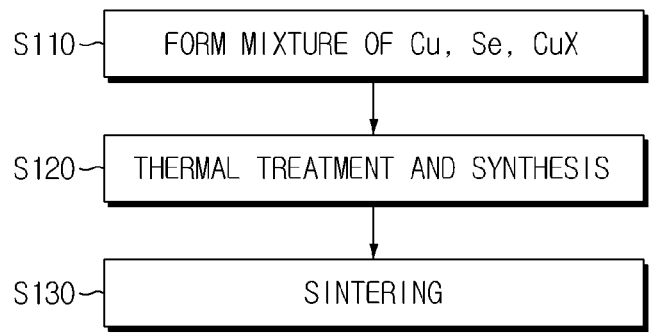
FIG. 1 is a schematic flowchart for illustrating a method for manufacturing a thermoelectric material according to an embodiment of the present disclosure.

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the spirit and scope of the disclosure.

A thermoelectric material according to an embodiment of the present disclosure may be expressed by Chemical Formula 1 below.

   <Chemical Formula 1>

$Cu_xSe_{1-y}X_y$

In Chemical Formula 1, X is at least one element selected from the group consisting of F, Cl, Br and I, $2<x\le2.6$ and $0<y<1$.

First, the thermoelectric material according to the present disclosure is a Cu—Se-based thermoelectric material including Cu and Se, in which Se is partially replaced with halogen elements. In other words, in the thermoelectric material according to the present disclosure, some Se sites may be deficient, and such deficient sites may be replaced with F, Cl, Br and/or I.

In addition, due to the above composition characteristic, the thermoelectric material according to the present disclosure may have improved thermoelectric conversion performance in comparison to traditional Cu—Se-based thermoelectric materials. Further, in the thermoelectric material according to the present disclosure, electric characteristics may be improved by replacing Se with a halogen element. In particular, in the thermoelectric material according to the present disclosure, electrical conductivity may be greatly improved by replacing a Se site with X to increase a hole concentration, namely a carrier concentration. Therefore, in the thermoelectric material according to the present disclosure, since electrical characteristics are optimized, more excellent thermal performance may be obtained in comparison to traditional Cu—Se-based thermoelectric materials.

In addition, the thermoelectric material according to the present disclosure includes a relatively greater content of Cu in comparison to traditional Cu—Se-based thermoelectric materials.

In other words, assuming that the sum content of Se and X is 1, the thermoelectric material according to the present disclosure is provided so that the content of Cu in comparison thereto is greater than 2. Due to the above feature of the present disclosure, thermal conductivity of the thermoelectric material, particularly lattice thermal conductivity, may be lowered, which may result in improvement of thermoelectric conversion performance.

In Chemical Formula 1, x may satisfy a condition of $x\le2.2$.

In particular, in Chemical Formula 1, the thermoelectric material according to the present disclosure may satisfy a condition of $x\le2.15$.

Further, in Chemical Formula 1, the thermoelectric material according to the present disclosure may satisfy a condition of $x\le2.1$.

In addition, in Chemical Formula 1, the thermoelectric material according to the present disclosure may satisfy a condition of $2.01\le x$.

In particular, in Chemical Formula 1, x may satisfy a condition of $2.025\le x$.

In addition, in Chemical Formula 1, y may satisfy a condition of $y<0.1$.

In addition, in Chemical Formula 1, y may satisfy a condition of $0.001\le y$.

In addition, in Chemical Formula 1, y may satisfy a condition of $y\le0.05$.

By using the above conditions, the thermoelectric material according to the present disclosure may have more improved thermoelectric conversion performance.

In this instance, a second phase may be partially included in the thermoelectric material represented by Chemical Formula 1, and its amount may change based on a thermal treatment condition.

As described above, the thermoelectric material according to the present disclosure may be provided so that, assuming that the content of Se is 1 in a Cu—Se-based thermoelectric material, the content of Cu is greater than 2 and Se is partially replaced with a halogen element. Therefore, due to the above composition characteristic, the thermoelectric material according to the present disclosure may have improved electrical conductivity, lowered thermal conductivity, increased ZT value and thus improved thermoelectric conversion performance in comparison to traditional Cu—Se-based thermoelectric materials.

FIG. 1 is a schematic flowchart for illustrating a method for manufacturing a thermoelectric material according to an embodiment of the present disclosure.

Referring to FIG. 1, a method for manufacturing a thermoelectric material according to the present disclosure may include a mixture forming step S110 and a compound forming step S120.

In the mixture forming step S110, CuX (a halogen compound including Cu) may be mixed as raw material in addition to Cu and Se according to Chemical Formula 1 to form a mixture.

Here, in the step S110, the raw materials may be mixed in a powder state. In this case, raw materials may be mixed better, and reactivity among the raw materials may be improved, which results in good synthesizing in the step S120.

In addition, in the mixture forming step S110, raw materials may be mixed by means of hand milling using a mortar, ball milling, planetary ball mill, and the like, but the present disclosure is not limited to these specific mixing methods.

In the compound forming step S120, the mixture formed in the step S110 is thermally treated to form a compound according to Chemical Formula 1, namely $Cu_xSe_{1-y}X_y$ (X is at least one of F, Cl, Br and I, $2<x\leq2.6$, $0<y<1$). Here, in the step S120, the mixture generated in the step S110 may be put into a furnace and heated at a predetermined temperature for a predetermined time so that the compound of Chemical Formula 1 may be formed.

Preferably, the step S120 may be performed by a solid state reaction (SSR) method. When the synthesis is performed by the solid state reaction method, the raw material used in the synthesis, that is, the mixture may cause reaction in a solid state without changing to a perfect liquid state during the synthesis.

For example, the step S120 may be performed in the temperature range of 200° C. to 650° C. for 1 to 24 hours. Because this temperature range is lower than a melting point of Cu, when the heating is performed in the temperature range, the $Cu_xSe_{1-y}X_y$ compound may be formed in which Cu does not melt. For example, the step S120 may be performed under the temperature condition of 450° C. for 15 hours.

In the step S120, in order to form $Cu_xSe_{1-y}X_y$, the mixture of Cu, Se and X may be put into a hard mold and formed into pellets, and the mixture in a pellet form may be put into a fused silica tube and vacuum-sealed. Also, the vacuum-sealed first mixture may be put into the furnace and thermally treated.

Preferably, as shown in FIG. 1, the method for manufacturing a thermoelectric material according to the present disclosure may further include sintering the compound under pressure S130 after the compound forming step S120 is performed.

Here, the step S130 may be performed by means of hot pressing (HP) or spark plasma sintering (SPS). The thermoelectric material according to the present disclosure may easily have a high sintering density and a thermoelectric performance improvement effect, when sintered by means of pressure sintering.

For example, the pressure sintering step may be performed under the pressure condition of 30 MPa to 200 MPa. Also, the pressure sintering step may be performed under the temperature condition of 300° C. to 800° C. Also, the pressure sintering step may be performed under the pressure and temperature conditions for 1 minute to 12 hours.

Also, the step S130 may be performed in a vacuum state or in a state where gas such as Ar, He, $N_2$, and the like containing some or no hydrogen is flowing.

Also preferably, in the step S130, the compound formed in the step S120 may be ground into powder, and then pressure sintering may be performed. In this case, the sintering and measuring step may be more conveniently performed, and the sintering density may further increase.

A thermoelectric conversion element according to the present disclosure may include the above thermoelectric material. Particularly, the thermoelectric material according to the present disclosure may effectively improve a ZT value in a broad temperature range, in comparison to traditional thermoelectric materials, particularly Cu—Se-based thermoelectric materials. Thus, the thermoelectric material according to the present disclosure may be used instead of traditional thermoelectric conversion materials or further used in a thermoelectric conversion element in conjunction with traditional thermoelectric conversion materials.

Further, the thermoelectric material according to the present disclosure may be used in a thermoelectric power generator designed for thermoelectric power generation using a waste heat source or the like. That is, the thermoelectric power generator according to the present disclosure includes the above thermoelectric material described above. The thermoelectric material according to the present disclosure exhibits a high conductivity in a broad temperature range, for example in a temperature range of 50° C. to 500° C., and thus may be more useful for thermoelectric power generation.

Also, the thermoelectric material according to the present disclosure may be manufactured as a bulk-type thermoelectric material.

Hereinafter, the present disclosure will be described in detail through examples and comparative examples. The examples of the present disclosure, however, may take several other forms, and the scope of the present disclosure should not be construed as being limited to the following examples. The examples of the present disclosure are provided to more fully explain the present disclosure to those having ordinary knowledge in the art to which the present disclosure pertains.

Example 1

In order to form a compound $Cu_{2.025}Se_{0.999}Br_{0.001}$, Cu, Se and CuBr in a powder form were weighed according to the chemical formula, and then put into an alumina mortar, followed by mixing. The mixed materials were put into a hard mold, formed into pellets, put into a fused silica tube, and vacuum-sealed. In addition, the resultant product was put into a box furnace and heated at 500° C. for 15 hours, and after heating, was slowly cooled down to room temperature to obtain a compound $Cu_{2.025}Se_{0.999}Br_{0.001}$. In addition, the compound $Cu_{2.025}Se_{0.999}Br_{0.001}$ was filled into a hard mold for hot pressing, and hot press sintering was performed thereto in the condition of 500° C. in a vacuum state to obtain a sample of Example 1. At this time, a sintering density was set to be 98% or above in comparison to a theoretical value.

Example 2

A compound $Cu_{2.025}Se_{0.997}Br_{0.003}$ was obtained by using the same mixing and synthesizing processes as Example 1, except that the contents of Se and Br were varied.

In addition, the compound was sintered in the same way as Example 1 to obtain a sample of Example 2.

Example 3

A compound $Cu_{2.025}Se_{0.95}Br_{0.05}$ was obtained by using the same mixing and synthesizing processes as Example 1, except that the contents of Se and Br were varied. In addition, the compound was sintered in the same way as Example 1 to obtain a sample of Example 3.

Example 4

In order to form a compound $Cu_{2.025}Se_{0.99}Cl_{0.01}$, Cu, Se and CuCl in a powder form were weighed according to the chemical formula, and then put into an alumina mortar, followed by mixing. The mixed materials were put into a hard mold, formed into pellets, put into a fused silica tube, and vacuum-sealed. In addition, the resultant product was put into a box furnace and heated at 500° C. for 15 hours, and after heating, was slowly cooled down to room temperature to obtain a compound $Cu_{2.025}Se_{0.99}Cl_{0.01}$. In addition, the compound was sintered in the same way as Example 1 to obtain a sample of Example 4.

Example 5

In order to form a $Cu_{2.025}Se_{0.99}I_{0.01}$, Cu, Se and CuI in a powder form were weighed according to the chemical formula, and then put into an alumina mortar, followed by mixing. The mixed materials were put into a hard mold, formed into pellets, put into a fused silica tube, and vacuum-sealed. In addition, the resultant product was put into a box furnace and heated at 500° C. for 15 hours, and after heating, was slowly cooled down to room temperature to obtain a compound $Cu_{2.025}Se_{0.99}I_{0.01}$. In addition, the compound was sintered in the same way as Example 1 to obtain a sample of Example 5.

Comparative Example

In order to form a compound $Cu_{2.025}Se$, Cu and Se in a powder form were weighed according to the chemical formula, and then put into an alumina mortar, followed by mixing. The mixed materials were put into a hard mold, formed into pellets, put into a fused silica tube, and vacuum-sealed. In addition, the resultant product was put into a box furnace and heated at 500° C. for 15 hours, and after heating, was slowly cooled down to room temperature to obtain a compound $Cu_{2.025}Se$. In addition, the compound was sintered in the same way as Example 1 to obtain a sample of the comparative example.

Figure 2:
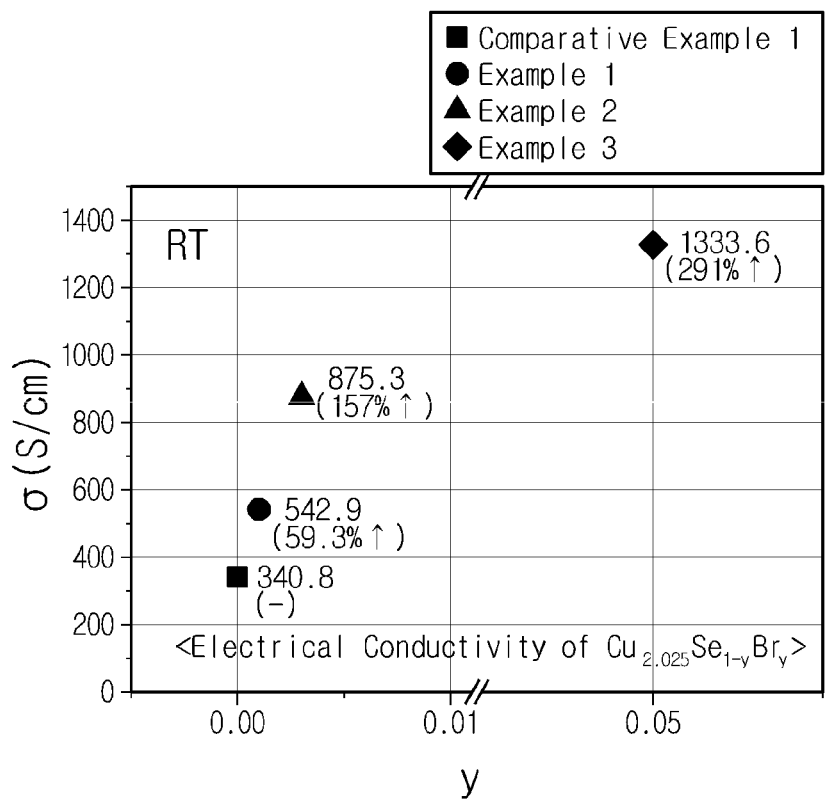
FIGS. 2 and 3 are graphs comparatively showing measurement results of electrical conductivity of thermoelectric material according to examples of the present disclosure and a comparative example.
Figure 3:
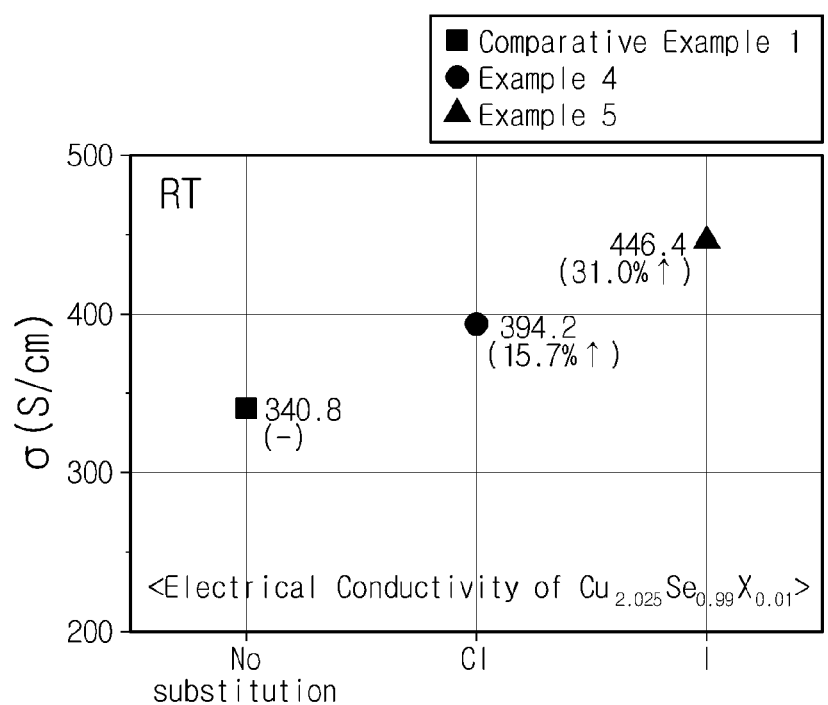

For the samples of Examples 1 to 5 and the comparative example, electrical conductivity was measured at room temperature (RT) by using ZEM-3 (Ulvac-Riko, Inc.). In addition, the measured electrical conductivity of Examples 1 to 3 is depicted in FIG. 2 together with the measurement result of the comparative example. In FIG. 2, the x axis represents y of Chemical Formula 1. In addition, the measured electrical conductivity of Examples 4 and 5 is depicted in FIG. 3 together with the measurement result of the comparative example. In FIG. 3, the x axis represents an element replaced with Se, namely the kind of X.

First, from the results of FIG. 2, it may be understood that the electrical conductivity of Examples 1 to 3 is higher than the electrical conductivity of the comparative example.

In more detail, in Example 1 where y is 0.001, the electrical conductivity is 542.9 S/cm, which increases by about 59.3% in comparison to the comparative example having electrical conductivity of 340.8 S/cm. In addition, in Example 2 where y is 0.003, the electrical conductivity is 875.3 S/cm, which increases by about 157% in comparison to the electrical conductivity of the comparative example. Moreover, in Example 3 where y is 0.05, the electrical conductivity is 1333.6 S/cm, which increases by about 291% in comparison to the electrical conductivity of the comparative example.

From the results of FIG. 2, it may be understood that in the thermoelectric material according to the present disclosure, Se is partially replaced with Br and thus the electrical conductivity of the Cu—Se-based thermoelectric material is greatly improved. Therefore, it may also be understood that in the thermoelectric material according to the present disclosure, due to the improved electrical conductivity, the thermoelectric conversion performance is also greatly improved. Further, referring to the results of FIG. 2, it may be found that the electrical conductivity is improved further if the amount of replaced Br is greater.

Next, referring to the results of FIG. 3, it may be understood that the electrical conductivity of Examples 4 and 5 is higher than the electrical conductivity of the comparative example.

In more detail, in Example 4 where Se is partially replaced with Cl, the electrical conductivity is 394.2 S/cm, which increases by about 15.7% in comparison to the electrical conductivity of the comparative example. In addition, in Example 5 where Se is partially replaced with I, the electrical conductivity is 446.4 S/cm, which increases by about 31% in comparison to the electrical conductivity of the comparative example.

From the results of FIG. 3, it may be understood that in the thermoelectric material according to the present disclosure, the electrical conductivity is improved even though Se is partially replaced with Br as well as another halogen element such as Cl and I. Therefore, in the thermoelectric material according to the present disclosure, the thermoelectric conversion performance may be greatly improved.

The present disclosure has been described in detail. However, it should be understood that the detailed description and specific examples, while indicating preferred embodiments of the disclosure, are given by way of illustration only, since various changes and modifications within the spirit and scope of the disclosure will become apparent to those skilled in the art from this detailed description.

What is claimed is:

1. A thermoelectric material, expressed by Chemical Formula 1 below:

$$Cu_xSe_{1-y}X_y \qquad \text{<Chemical Formula 1>}$$

wherein X is 2<x≤2.6 and 0<y<1,
wherein the thermoelectric material is formed by thermally treating a powder mixture of Cu, Se, and CuX via a solid state reaction (SSR) method.

2. The thermoelectric material according to claim 1, wherein in Chemical Formula 1, x satisfies a condition of x≤2.2.

3. The thermoelectric material according to claim 1, wherein in Chemical Formula 1, x satisfies a condition of x≤2.1.

4. The thermoelectric material according to claim 1, wherein in Chemical Formula 1, x satisfies a condition of 2.025≤x.

5. The thermoelectric material according to claim 1, wherein in Chemical Formula 1, y satisfies a condition of y<0.1.

6. The thermoelectric material according to claim 1, wherein in Chemical Formula 1, y satisfies a condition of y≤0.05.

7. A method for manufacturing a thermoelectric material, the method comprising:
forming a powder mixture by weighing and mixing Cu, Se and CuX; and
thermally treating the powder mixture via a solid state reaction (SSR) method to synthesize a compound expressed by the following Chemical Formula 1:

$Cu_xSe_{1-y}X_y$                             <Chemical Formula 1> where X is 2<x≤2.6 and 0<y<1.

8. The method for manufacturing a thermoelectric material according to claim 7, further comprising:
sintering the compound under pressure after the compound forming step is performed.

9. The method for manufacturing a thermoelectric material according to claim 8, wherein the pressure sintering step is performed by means of hot pressing or spark plasma sintering.

10. A thermoelectric conversion element, comprising a thermoelectric material defined in claim 1.

11. A thermoelectric power generator, comprising a thermoelectric material according to claim 1.

12. The thermoelectric material of claim 1, wherein the solid state reaction (SSR) method is performed at a temperature lower than a melting point of Cu.

13. The method for manufacturing a thermoelectric material according to claim 7, wherein the solid state reaction (SSR) method is performed at a temperature lower than a melting point of Cu.

14. A thermoelectric material manufactured according to the method of claim 7.

15. A thermoelectric material, expressed by Chemical Formula 1 below:

$Cu_xSe_{1-y}X_y$                             <Chemical Formula 1> wherein X is Br, and
wherein 2<x≤2.6 and 0<y<1.

* * * * *